United States Patent
Hoshi et al.

(10) Patent No.: US 7,351,670 B2
(45) Date of Patent: Apr. 1, 2008

(54) METHOD FOR PRODUCING SILICON NITRIDE FILMS AND PROCESS FOR FABRICATING SEMICONDUCTOR DEVICES USING SAID METHOD

(75) Inventors: Takeshi Hoshi, Kanagawa-ken (JP); Tsuyoshi Saito, Kanagawa-ken (JP); Takako Kimura, Ibaraki (JP); Christian Dussarrat, Ibaraki (JP); Kazutaka Yanagita, Ibaraki (JP)

(73) Assignee: L'Air Liquide, Societe Anonyme A Directoire et Conseil de Surveillance pour l'Etude et l'Exploitation des Procedes Georges Claude, Paris (FR)

( * ) Notice: Subject to any disclaimer, the term of this patent is extended or adjusted under 35 U.S.C. 154(b) by 240 days.

(21) Appl. No.: 11/020,712

(22) Filed: Dec. 23, 2004

(65) Prior Publication Data

US 2005/0158983 A1 Jul. 21, 2005

(30) Foreign Application Priority Data

Dec. 25, 2003 (JP) ............................. 2003-428942
Nov. 24, 2004 (JP) ............................. 2004-338459

(51) Int. Cl.
*H01L 21/31* (2006.01)

(52) U.S. Cl. ...................... 438/791; 438/623; 438/778; 257/E21.293; 257/E21.268

(58) Field of Classification Search ...................... None
See application file for complete search history.

(56) References Cited

U.S. PATENT DOCUMENTS

| 5,508,067 A * | 4/1996 | Sato et al. .................. 427/579 |
| 2003/0168707 A1* | 9/2003 | Sakamoto et al. .......... 257/411 |
| 2004/0121085 A1* | 6/2004 | Wang et al. ................ 427/569 |

OTHER PUBLICATIONS

Yasui et al., Appl. Phys. Lett. 56 (10), Mar. 5, 1990, p. 898-900, "Amorphous SiN films grown by hot-filament chemical vapor deposition using monomethylamine".
Patent Abstracts of Japan, publication No. 2002009072, application No. 2000189434, application date Jun. 23, 2000.

* cited by examiner

*Primary Examiner*—Michael Lebentritt
*Assistant Examiner*—Kyoung Lee
(74) *Attorney, Agent, or Firm*—Brandon Clark

(57) ABSTRACT

Silicon nitride film is formed on a silicon wafer mounted in a boat in an LPCVD tool by feeding a silicon source ($SiH_2Cl_2$, $SiCl_4$, $Si_2Cl_6$, etc.) from an injector and feeding a mixed gas of monomethylamine ($CH_3NH_2$) and ammonia ($NH_3$) as the nitrogen source from an injector. This addition of monomethylamine to the source substances for film production makes it possible to provide an improved film quality and improved leakage characteristics even at low temperatures (450-600° C.).

12 Claims, 6 Drawing Sheets

METHOD FOR PRODUCING SILICON NITRIDE FILMS AND PROCESS FOR FABRICATING SEMICONDUCTOR DEVICES USING SAID METHOD

This application claims the benefit of priority under 35 U.S.C. § 119 (a) and (b) to Japanese Application No. 2003-428942, filed Dec. 25, 2003, and Japanese Application No. 2004-338459, filed Nov. 24, 2004, the entire contents of which are incorporated herein by reference.

BACKGROUND

This invention relates to a method for producing silicon nitride films and to a process for fabricating semiconductor devices using said method.

When the fabrication of silicon nitride film is carried out by the generally known low-pressure chemical vapor deposition (LPCVD) procedure using ammonia ($NH_3$) and a silicon source such as dichlorosilane ($SiH_2Cl_2$), tetrachlorosilane ($SiCl_4$), or hexachlorodisilane ($Si_2Cl_6$), a substantial deterioration in leakage characteristics and wet etching resistance is noted when the film production temperature declines below, for example, 600° C. It is thought that the generation of silicon-nitrogen bonds by reaction between the silicon source and nitrogen source is not promoted in such a low-temperature film-formation process and that the resulting occurrence of a large number of silicon dangling bonds in the silicon nitride film causes the deterioration in film quality.

The use of monomethylamine ($CH_3NH_2$) as a nitrogen source in place of ammonia ($NH_3$) is described in Yasui, et al., Appl. Phys. Lett. 56(10), 5 Mar. 1990, p. 898-900, "Amorphous SiN films grown by hot-filament chemical vapor deposition using monomethylamine", with the goal of improving silicon nitride film quality. This article concerns an evaluation of silicon nitride film formation at 600-800° C. by hot-filament CVD and thermal CVD using monosilane ($SiH_4$) as the silicon source and monomethylamine ($CH_3NH_2$) as the nitrogen source. Monomethylamine ($CH_3NH_2$) was selected for the nitrogen source in this study because the decomposition energy of monomethylamine ($CH_3NH_2$) is, at 3.4 eV ($CH_3NH_2$), less than the 4.48 eV ($NH_2$—H) of ammonia ($NH_3$). The result was a reduction in the hydrogen concentration in the film to $\leq 1 \times 10^{21}$ $cm^{-3}$ at a film-formation temperature of 600° C.

JP 2002-009072 describes a method for forming silicon nitride films at 400-650° C. by LPCVD using trimethylamine (($CH_3$)$_3$N, an amine-type gas) for the nitrogen source and a silane-type gas. However, this method requires that the trimethylamine (($CH_3$)$_3$N) be preheated to 500-700° C. due to its high heat capacity. It is also stated that an insufficiently nitridated silicon nitride film (refractive index: RI=2.9) is obtained when silicon nitride film production is carried out, for example, at 550° C., without this preheating.

Yasui et al., Appl. Phys. Lett. 56(10), 5 Mar. 1990, p. 898-900, "Amorphous SiN films grown by hot-filament chemical vapor deposition using monomethylamine"

Japanese Laid Open (Unexamined or Kokai or A) Patent Application Number 2002-009072.

The silicon nitride films produced by LPCVD exhibit a very good coverage ratio and are broadly utilized in the fabrication of transistors (MOSFETs, etc.). However, their film properties undergo deterioration (deterioration in leakage properties, increase in impurities, etc.) when their production temperature is lowered for the purpose of reducing the thermal effects on the semiconductor device.

For example, when low-temperature silicon nitride film is produced by LPCVD using ammonia ($NH_3$) and a silicon source such as hexachlorodisilane ($Si_2Cl_6$), the lower film-fabrication temperatures are accompanied by a deterioration in leakage properties, a deterioration in the wet etching resistance, and a substantial increase in the levels of hydrogen (H) and chlorine (Cl) in the film. It is thought that the generation of silicon-nitrogen bonds by reaction between the silicon source and nitrogen source is not promoted in the low-temperature film-formation process (for example, $\leq 600°$ C.) and that the resulting presence of a large number of silicon dangling bonds in the silicon nitride film is a cause of the deterioration in film quality.

In order to realize even lower thermal budgets when silicon nitride film is used for the sidewall film formed on the sidewall of the gate electrode of a semiconductor device or is used as the liner film elaborated prior to production of the interlayer dielectric film, a method is required that can produce high-quality silicon nitride film at high coverage ratios at film-formation temperatures $\leq 500°$ C., for example, at 450° C. However, issues with regard to a reduced electrical reliability by the semiconductor device are created by the deterioration in leakage characteristics and other problems that accompany lower film-formation temperatures.

Silicon nitride film production at a film-formation temperature $\leq 600°$ C. is not accomplished in Yasui, et al. With regard to JP 2002-009072, due to the use of trimethylamine, the required film properties cannot be obtained without preheating the gas.

SUMMARY

The object of this invention is to improve the properties of low-temperature LPCVD silicon nitride films by improving, inter alia, their leakage properties and wet etch resistance by terminating the silicon dangling bonds present in low-temperature (450-600° C.) silicon nitride films with carbon that carries a carbon-hydrogen bond.

The present invention is characterized by the use for the formation of low-temperature silicon nitride film by LPCVD of ammonia ($NH_3$) as nitrogen source, monomethylamine ($CH_3NH_2$) as the C—H bond-containing source, and Si-containing gas (e.g., monosilane ($SiH_4$), disilane ($Si_2H_6$), dichlorosilane ($SiH_2Cl_2$), tetrachlorosilane ($SiC_4$), hexachlorodisilane ($Si_2Cl_6$)) as silicon source.

This invention relates to a method for forming silicon nitride films and to a process for fabricating semiconductor devices using this method.

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
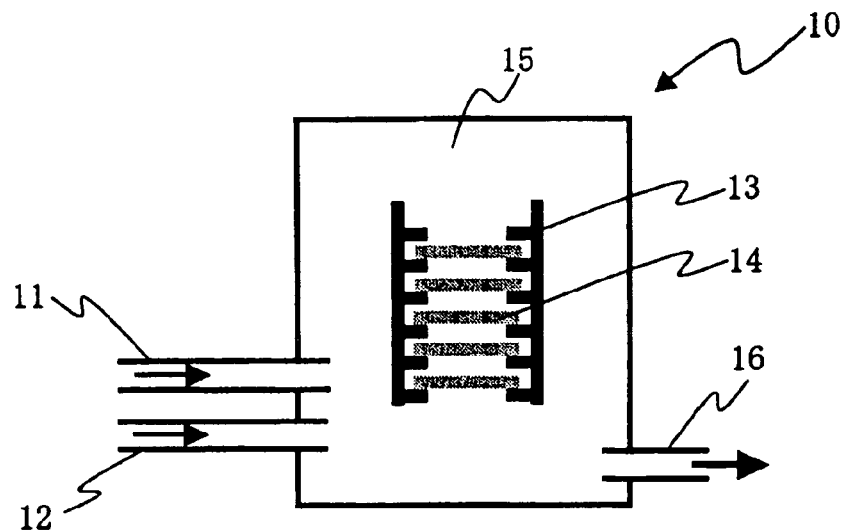
FIG. 1 illustrates an LPCVD tool, which may be used, according to one embodiment of the current invention, for forming silicon nitride films.

The object of this invention is to improve the properties of low-temperature LPCVD silicon nitride films by improving, inter alia, their leakage properties and wet etch resistance by terminating the silicon dangling bonds present in low-temperature (450-600° C.) silicon nitride films with carbon that carries a carbon-hydrogen bond.

The reason for the use of monomethylamine ($CH_3NH_2$) as the C—H bond-containing source in the aforementioned fabrication of silicon nitride film is that the 3.4 eV bond energy of monomethylamine ($CH_3NH_2$), being less than the 4.48 eV bond energy of the ammonia ($NH_2$—H) used as the nitrogen source, enables degradation of the $CH_3$—$NH_2$ bond to occur to a satisfactory degree even at low temperatures. This enables the production of methyl ($CH_3$) that will terminate the silicon dangling bonds.

Gas other than monomethylamine ($CH_3NH_2$) that contains methyl in the source substance can be used, such as dimethylamine (($CH_3$)$_2$(NH)) and trimethylamine (($CH_3$)$_3$N). It is also possible to use gas that contains a non-methyl alkyl group such as ethyl, propyl, butyl, and so forth.

This invention relates to a method for forming silicon nitride films and to a process for fabricating semiconductor devices using this method. The following various embodiments of the invention include:

(a) A method for forming silicon nitride film, that is characterized by the use of gas (monosilane, disilane, dichlorosilane, tetrachlorosilane, hexachiorodisilane, etc.) that contains at least silicon in the source substance as silicon source and gas (ammonia, etc.) that contains at least nitrogen in the source substance as the nitrogen source and by the additional use of gas that contains at least the carbon-hydrogen bond in the source substance.

(b) A method for forming silicon nitride film, characterized by the use of gas (monosilane, disilane, dichlorosilane, tetrachlorosilane, hexachiorodisilane, etc.) that contains at least silicon in the source substance as silicon source and gas (ammonia, etc.) that contains at least nitrogen in the source substance as the nitrogen source and by the additional use of gas that contains at least the methyl group in the source substance.

(c) A method for forming silicon nitride film, characterized by the use of gas that contains at least silicon in the source substance as silicon source and gas that contains at least nitrogen in the source substance as the nitrogen source and by the additional use of gas that contains at least an alkyl group (methyl, ethyl, propyl, butyl, etc.) in the source substance.

(d) A method for forming silicon nitride film, characterized by the use as described above of gas that contains at least nitrogen and methyl in the source substance as the nitrogen source.

(e) A method for forming silicon nitride film, characterized by the use as described above of gas that contains at least nitrogen and alkyl (e.g., methyl, ethyl, propyl, butyl) in the source substance as the nitrogen source.

(f) A method for forming silicon nitride film, characterized by the use of gas that contains at least nitrogen and methyl in the source substance as the gas as described above that contains at least the carbon-hydrogen bond in the source substance.

(g) A method for forming silicon nitride film, characterized by the use of gas that contains at least nitrogen and alkyl in the source substance as the gas as described above that contains at least the carbon-hydrogen bond in the source substance.

(h) A method for forming silicon nitride film, characterized by the use of gas that contains at least methylamine in the source substance as the gas as described above that contains at least the carbon-hydrogen bond in the source substance.

(i) A method for forming silicon nitride film, characterized in that the silicon nitride film formation as described above is carried out by low-pressure CVD.

(j) A method for forming silicon nitride film, characterized in that, when film formation is carried out using the source substances as described above to give silicon nitride film containing 0.7-1.3 nitrogen where the silicon component is designated as 1, said silicon nitride film contains 0.1-0.6 carbon.

(k) A method for forming silicon nitride film, characterized by the use of chlorine- and silicon-containing gas comprising dichlorosilane, tetrachlorosilane, or hexachlorodisilane as the silicon source as described above and the use of methyl- and nitrogen-containing gas comprising monomethylamine, dimethylamine, or trimethylamine as the nitrogen source.

(l) A process for fabricating a semiconductor device in which a source region and a drain region separated by a gap are formed in a semiconductor substrate, a gate electrode is formed above the channel region that is formed in the gap between the source region and drain region wherein the gate electrode is separated from the channel region by a gate dielectric film, a source electrode is formed on the source region, a drain electrode is formed on the drain region, and sidewall film comprising silicon nitride film is formed on the sidewalls of the gate dielectric film and gate electrode, said method being characterized by the use for formation of the sidewall film comprising silicon nitride of gas that contains at least silicon in the source substance as silicon source and gas that contains at least nitrogen in the source substance as the nitrogen source and by the additional use of gas that contains at least the carbon-hydrogen bond.

(m) A process for fabricating a semiconductor device that characteristically uses low-pressure CVD for formation of the silicon nitride film as described above wherein the silicon nitride film formation temperature is at least 450° C. but no more than 600° C.

(n) A process for fabricating a semiconductor device, characterized by the use of a metal silicide film for the source electrode and drain electrode as described above.

(o) A process for fabricating a semiconductor device, characterized in that, after formation of the metal silicide film as described above, a liner film comprising silicon nitride film is formed on the entire surface containing this metal silicide film and the gate electrode, wherein said liner film comprising silicon nitride film is produced using low-pressure CVD, gas that contains at least chlorine and silicon in the source substance as silicon source, and gas that contains at least methyl and nitrogen in the source substance as the nitrogen source.

(p) A process for fabricating a semiconductor device that characteristically uses low-pressure CVD for formation of the silicon nitride film as described above, wherein the liner film comprising silicon nitride film is formed at a temperature of at least 450° C. but no more than 600° C.

(q) A process for fabricating a semiconductor device, characterized in that, after formation of the liner film comprising silicon nitride film as described above, an interlayer dielectric film is formed on the liner film; the interlayer dielectric film is selectively etched over the gate electrode, source electrode, and drain electrode; and metal is filled into the etched regions.

(r) A process for fabricating a semiconductor device, characterized by elaborating metal interconnects on the interlayer dielectric film after metal has been filled into the etched regions as described above, wherein the metal interconnects are connected with the metal fill.

The present invention carries out silicon nitride film formation at low temperatures and thereby enables a reduction in the thermal budget from that imposed by the prior-art high-temperature production of silicon nitride films for semiconductor devices such as MOSFETs. In addition, by providing silicon nitride film with improved film properties, this invention provides improved reliability for the electrical properties of semiconductor devices such as MOSFETs.

As a particular matter, application of this invention to the sidewalls of a semiconductor device such as a MOSFET can improve the leakage characteristics for this sidewall and can suppress impurity diffusion into the gate dielectric film and gate electrode encompassed by the sidewall. This results in stabilization of the electrical properties of the semiconductor device, e.g., a MOSFET.

EXAMPLES

Embodiments of the present invention are described in the following with reference to the following examples.

Example 1

FIG. 1 illustrates an LPCVD tool for executing the method according to the present invention for forming silicon nitride films. Silicon source ($SiH_2Cl_2$, $SiCl_4$, $Si_2Cl_6$, etc.) gas is fed into this LPCVD tool 10 from the injector 11; a mixed gas of monomethylamine ($CH_3NH_2$) and ammonia ($NH_3$) as nitrogen source is fed from the injector 12; and a silicon nitride film is formed on the silicon 14 that is mounted in the boat 13 in the reaction compartment 15. Reference symbol 16 refers to an exhaust port.

The addition of the monomethylamine makes it possible to terminate the silicon dangling bonds with the methyl group and thereby enables an improvement in the film quality and leakage characteristics, etc., even at low temperatures (450-600° C.). While low temperatures (450-600° C.) are identified for the film-formation temperature, the film-formation temperature is not limited to these temperatures.

In specific terms, a silicon nitride film is formed on the silicon 14 mounted in the boat 13 by the feed of a silicon source ($Si_2Cl_6$) from the injector 11 and the feed of a nitrogen source ($CH_3NH_2+NH_3$) from the injector 12 into the LPCVD tool 10.

The film-formation conditions here can be exemplified as follows: temperature=525° C. (midpoint temperature in the low-temperature range of 450-600° C.), pressure=1 torr, $Si_2Cl_6$ flow rate=2 cc, $CH_3NH_2$ flow rate=3 cc, and $NH_3$ flow rate=17 cc. The film properties of the silicon nitride film can as a consequence be improved due to the highly efficient reaction of the $CH_3NH_2$ and $Si_2Cl_6$, which are thoroughly decomposed at the film-formation temperature of 525° C. The film-formation conditions are not limited to the preceding, and, for example, temperatures of 450-600° C., pressures of about 0.2-5 torr, and gas flow rate ratios ($Si_2Cl_6$ flow rate/($CH_3NH_2+NH_3$ flow rate)) of about 1/10 to 1/100 are desirable.

This low-temperature film formation provides increased device reliability because it provides an improved silicon nitride film quality without the application of excess heat to the semiconductor device during the device fabrication process.

Examples of the improved film quality are illustrated in FIGS. 2-6. The film-formation conditions are as follows: temperature=525° C., pressure=1 torr, $Si_2Cl_6$ flow rate=2 cc, and $CH_3NH_2+NH_3$ flow rate=20 cc.

Figure 2:
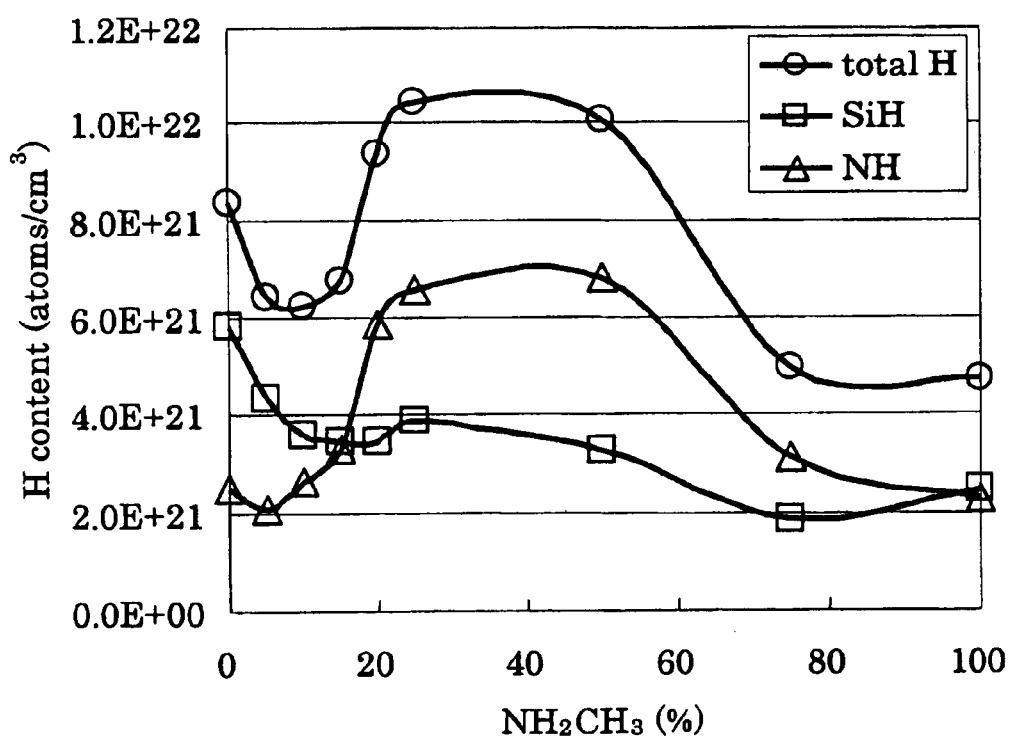
FIG. 2 illustrates the relationship between the SiH and NH concentrations in a silicone nitride film.

FIG. 2 reports the results of a determination of the SiH concentration and NH concentration in the silicon nitride film by FT-IR (Fourier-transform infrared spectroscopy) measurement. The SiH+NH concentration is reduced in this figure in the range of 5-20% for the ratio $CH_3NH_2/(CH_3NH_2+NH_3)$ between the monomethylamine ($CH_3NH_2$) and ammonia in the nitrogen source.

Figure 3:
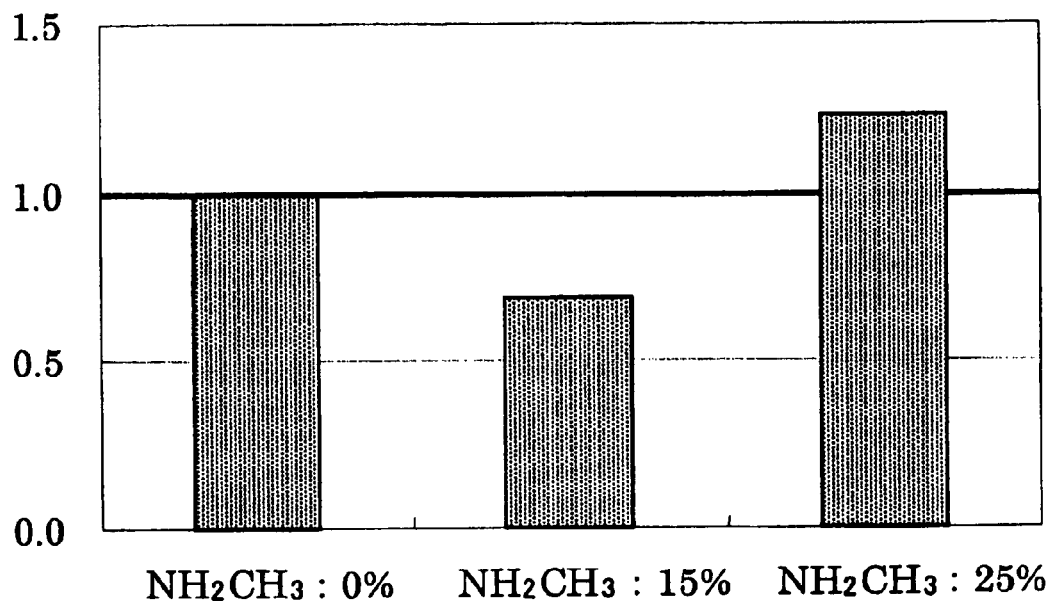
FIG. 3 illustrates the amount of water desorbed from a silicon nitride film, as measured by TDS (thermal desorption gas analysis)

FIG. 3 contains a comparative evaluation of the integrated value over temperature of the measured intensity of the amount of $H_2O$ desorption from the silicon nitride film in TDS (thermal desorption gas analysis) analysis for 0%, 15%, and 25% monomethylamine ($CH_3NH_2/(CH_3NH_2+NH_3)$).

This comparative evaluation shows that 15% monomethylamine ($CH_3NH_2$) provided less $H_2O$ desorption than for the heretofore used 100% ammonia ($NH_3$) (0% for the monomethylamine ratio ($CH_3NH_2/(CH_3NH_2+NH_3)$), while 25% monomethylamine ($CH_3NH_2$) provided more $H_2O$ desorption.

Therefore, in connection with the range shown in FIG. 2 of 5-20% $CH_3NH_2$ addition to $NH_3$ for the nitrogen source, this evaluation shows that the amount of moisture absorption from the atmosphere after silicon nitride film production is reduced by the addition of up to about 20% $CH_3NH_2$.

Figure 4:
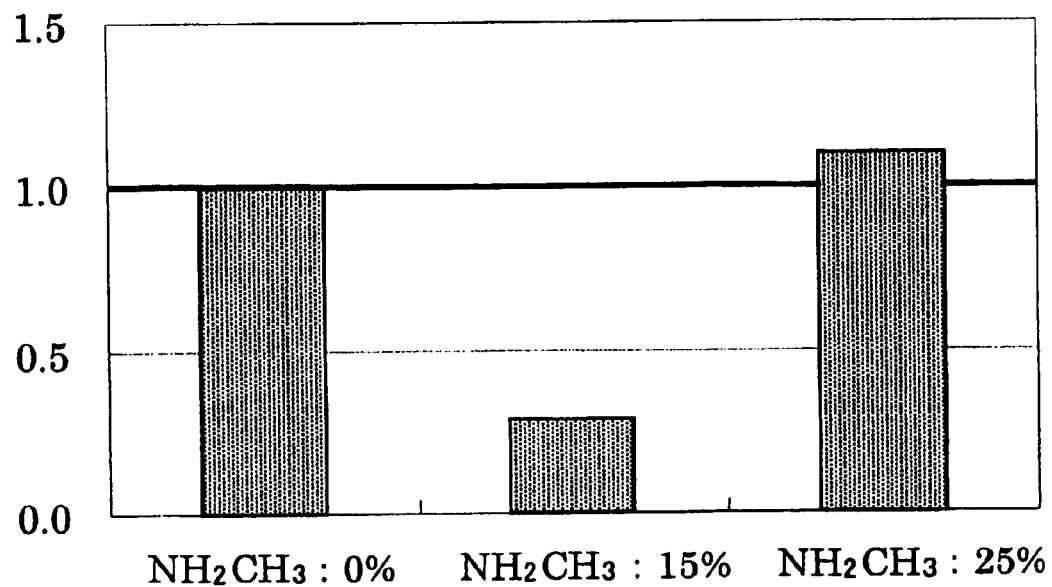
FIG. 4 illustrates the amount of HCL desorbed from a silicon nitride film, as measured by TDS.

In similar fashion to FIG. 3, FIG. 4 contains an evaluation of the amount of HCl desorption from the silicon nitride film in TDS analysis for 0%, 15%, and 25% monomethylamine. This comparative evaluation shows that 15% monomethylamine ($CH_3NH_2$) provided less HCl desorption than for the heretofore used 100% ammonia ($NH_3$) (0% for the monomethylamine ratio), while 25% monomethylamine ($CH_3NH_2$) provided more HCl desorption.

Therefore, in connection with the range shown in FIG. 2 of 5-20% $CH_3NH_2$ addition to $NH_3$ ($CH_3NH_2/(CH_3NH_2+NH_3)$) for the nitrogen source, this evaluation shows that the amount of chlorine incorporated into the silicon nitride film is reduced by the addition of up to about 20% $CH_3NH_2$.

Figure 5:
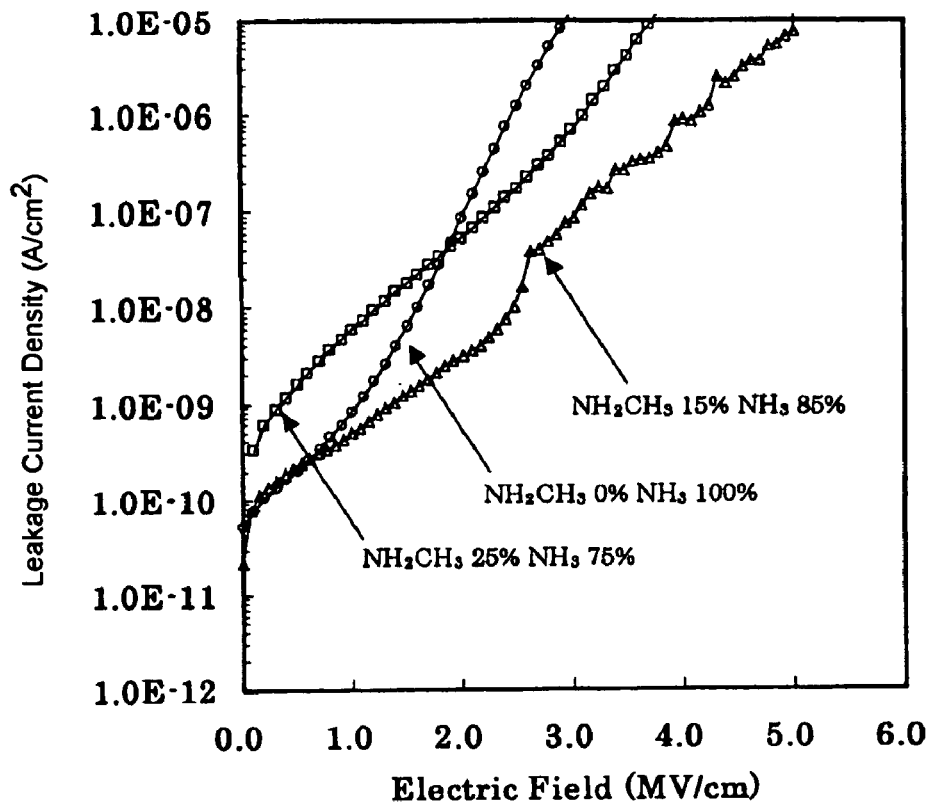
FIG. 5 illustrates the relationship between the electric field and the current leakage density for a silicon nitride film.

FIG. 5 reports the results of a determination of the IV characteristics of silicon nitride films produced on Si substrates in accordance with FIG. 1. With regard to this characteristic, the leakage for 15% $CH_3NH_2$, 85% $NH_3$ from low field to high field than for the heretofore used 0% $CH_3NH_2$, 100% $NH_3$. For example, while the leakage current density is the same at a field of 0-1 MV/cm, an improved leakage characteristic is provided by 15% $CH_3NH_2$, 85% $NH_3$ at a field greater than 1 MV/cm. It is thought that this improved leakage characteristic is due to a lower impurity level in the silicon nitride film and a better film quality for the silicon nitride film. 25% $CH_3NH_2$, 75% $NH_3$ provides an improved leakage characteristic at fields above 2 MV/cm, which, however, is not as significant as for 15% $CH_3NH_2$, 85% $NH_3$.

Therefore, considering FIGS. 2-4, the optimal addition of $CH_3NH_2$ is in the range up to about 20%.

Figure 6:
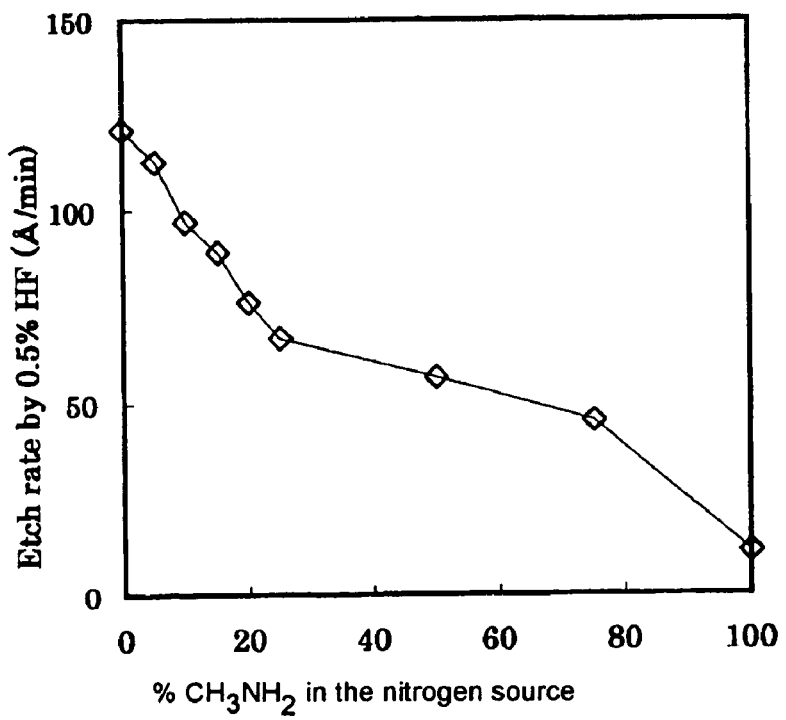
FIG. 6 illustrates the wet etch rate of a silicon nitride film.

FIG. 6 reports the relationship between the % monomethylamine ($CH_3NH_2$) in the nitrogen source and the etch rate during wet etching with HF solution. One notes a relationship in which the etch rate declines as the % $CH_3NH_2$ increases. This is thought to be due to an increased resistance to etching by HF solution due to an increase in the density of the silicon nitride film generated by the carbon supplied from the $CH_3NH_2$. In particular, a sharp decline is noted during the increase in % $CH_3NH_2$ to 25%, and the optimal range is therefore up to about 20% considering FIGS. 2-5.

When silicon nitride film was produced under the conditions specified for Example 1, a substantial improvement in film quality was obtained for 5-20% monomethylamine ($CH_3NH_2$) in the nitrogen source. When plotted against the concentration of carbon incorporated into the silicon nitride film, this range corresponds to 10-15% carbon in the film composition as shown in FIG. 7.

Figure 7:
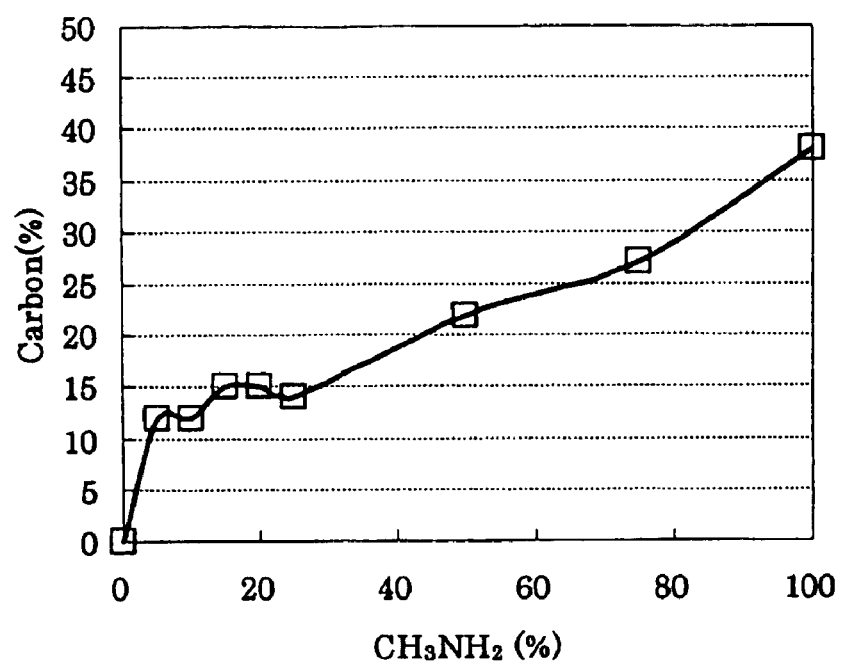
FIG. 7 illustrates the carbon concentration (%) in the silicon nitride film versus the amount of monomethylamine ($CH_3NH_2$) added during formation of the silicon nitride film.
Figure 8:
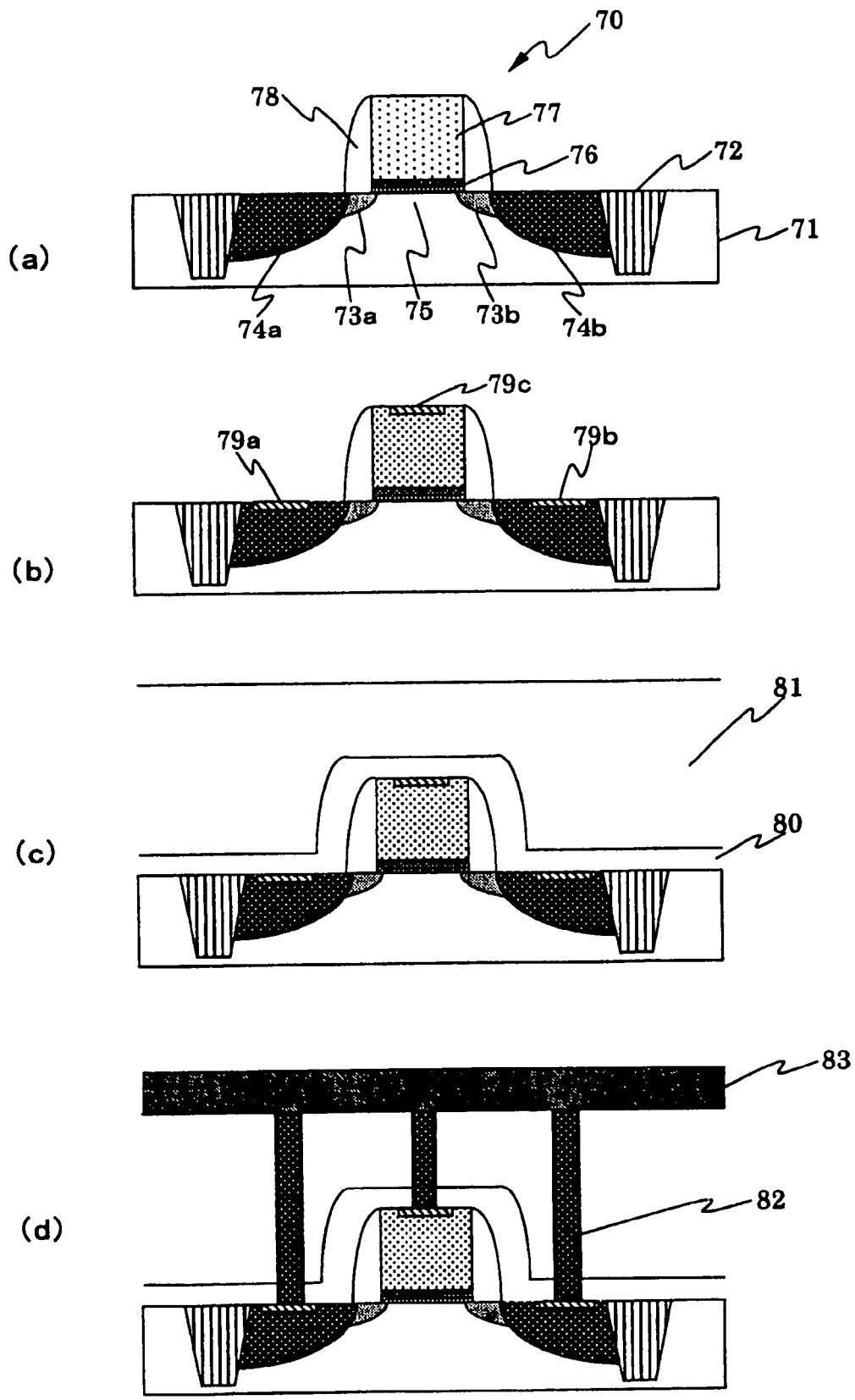
FIG. 8 illustrates a process for fabricating a semiconductor device that contains silicon nitride film.
Figure 9:
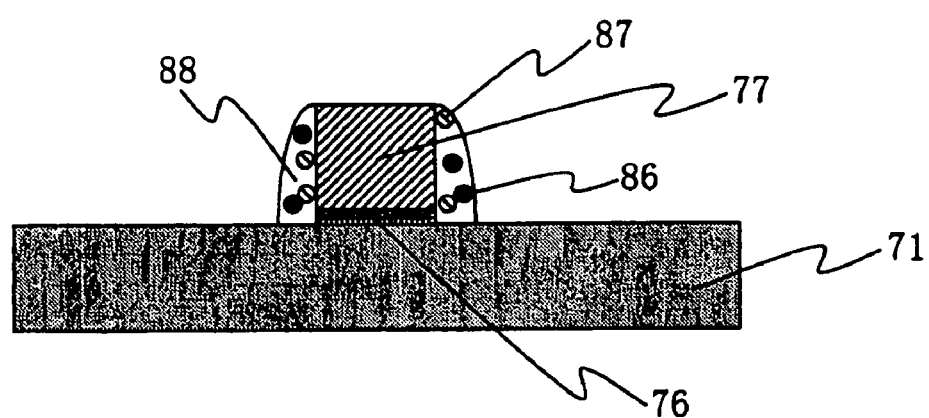
FIG. 9 illustrates a semiconductor device that has been fabricated using a conventional method for forming silicon nitride film.

FIG. 7 reports experimental data taken at a film-formation temperature of 525° C. The carbon concentration here is about 0.1-0.6 C: 1 Si for a nitrogen/silicon ratio in the silicon nitride film brought to 0.7-1.3 (composition range obtained by varying the atomic ratio during CVD film formation).

It is thought that a primary factor for the improvement in film quality seen in FIGS. 2-5 is the termination of the silicon dangling bonds present in the silicon nitride film by the methyl group. Accordingly, while methyl was introduced into the silicon nitride film in this example using monomethylamine, the same results as in this example can be obtained by producing silicon nitride film with a 10-15% carbon concentration using a silicon source, nitrogen source, and a methyl-containing gas such as trimethylsilane (($CH_3$)$_3SiH$).

Example 2

Figures (a) through (d) contain process cross sections that illustrate an example of the application of the inventive silicon nitride film to a MOSFET (dielectric gate transistor).

As shown in Figure (a), an element isolation region 72 comprising a dielectric (e.g., $SiO_2$) is formed on a silicon substrate 71 and a MOSFET 70 is formed in the region defined by the element-forming regions. This MOSFET 70 is constituted of source and drain extension regions 73*a*, 73*b* (denoted below as SD extensions) that have been ion-implanted with boron (B), a source region 74*a* and drain region 74*b* corresponding to these SD extensions, and a gate electrode 77 separated by an intervening gate dielectric film 76.

A channel region 75 is formed between the SD extensions in this MOSFET 70, while a sidewall film 78 is formed on the sidewall surfaces of the gate dielectric film 76 and gate electrode 77. This sidewall film 78 comprises $Si_3N_4$ film and is formed using the LPCVD tool shown in FIG. 1 and the production conditions given in Example 1 and a film-formation temperature around 500° C.

The gate dielectric film under consideration frequently has a two-layer structure in which the lower layer is $SiO_2$ film and the upper layer is formed of a high-k film such as $HfO_2$. The inventive silicon nitride film may be used for the lower film in these cases. A trilayer film may also be used in which the lower layer is $SiO_2$ film, the middle layer is the silicon nitride film, and the upper layer is a high-k film.

A polysilicon film, for example, is then formed on the source region 74*a* and the drain region 74*b* as shown in Figure (b) and a nickel film, for example, is formed on the surface thereof to provide individual electrodes 79*a* and 79*b* comprising nickel silicide. The gate electrode surface is preferably also provided with a silicided electrode 79*c*.

Then, as shown in Figure (c), a silicon nitride film 80 comprising, for example, $Si_3N_4$, is formed over the entirety of the silicided gate electrode, source electrode, and drain electrode. This silicon nitride film 80 forms a liner film; this liner film can be formed under the same conditions as in Example 1 to a thickness of about 50 nm. A relatively thick interlayer dielectric film 81 comprising $SiO_2$ is formed on this liner film 80.

As shown in Figure (d), this interlayer dielectric film 81 is selectively etched to form openings that are filled with metal 82. This is followed by the elaboration of interconnects 83 of, for example, aluminum, thus completing the process.

While low-pressure CVD is preferred for production of the aforementioned silicon nitride film, the subject silicon nitride film can be produced by atmospheric pressure CVD or by some other technique such as, for example, plasma CVD or catalytic CVD.

Due to the addition in Example 2 of monomethylamine ($CH_3NH_2$) to the film-formation source substances used for fabrication of the silicon nitride sidewall film, the lateral leakage at the prior-art sidewall 88 shown in Figure is also eliminated and the concentrations of chlorine 86 and hydrogen 87 in the film are lowered. The additional use of the silicon nitride film for the liner film can provide a stable MOSFET that is also free of surface leakage. Moreover, use of the silicon nitride film as the lower layer in the gate dielectric film results in an extremely small source/drain leakage.

While Example 2 employed the addition of monomethylamine to the silicon and nitrogen sources in the production of the sidewall and liner films in a MOSFET, this addition can also be used with the dielectric films in SOI structures and the protective films on the device surface.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A method which may be used for forming a silicon nitride film with a gaseous silicon source, a gaseous nitrogen source, and a gaseous carbon-hydrogen source, wherein:
    a) said silicon source comprises at least silicon;
    b) said nitrogen source comprises at least nitrogen; and
    c) said carbon-hydrogen source comprises methylamine.

2. The method of claim 1, wherein said nitrogen source further comprises at least one compound comprising a methyl group.

3. The method of claim 1, wherein said nitrogen source further comprises at least one compound comprising an alkyl group.

4. The method of claim 1, wherein said carbon-hydrogen source further comprises nitrogen and at least one compound comprising a methyl group.

5. The method of claim 1, wherein said carbon-hydrogen source further comprises nitrogen and a compound comprising an alkyl group.

6. The method of claim 1, further comprising forming said silicon nitride film by low pressure CVD.

7. The method of claim 1, wherein:
  a) the ratio of the concentration of nitrogen to silicon in said silicon nitride film is in the range of about 0.7:1 to about 1.3:1; and
  b) the ratio of the concentration of carbon to silicon in said silicon nitride film is in the range of about 0.1:1 to about 0.6:1.

8. The method of claim 1, wherein:
  a) said silicon source comprises at least one member selected from the group consisting of:
    1) dichlorosilane;
    2) tetrachlorosilane; and
    3) hexachlorodisilane; and
  b) said nitrogen source comprises at least one member selected from the group consisting of:
    1) monomethylamine;
    2) dimethylamine; and
    3) trimethylamine.

9. A method which may be used for forming a silicon nitride film in a semiconductor device, comprising forming a silicon nitride film with a gaseous silicon source, a gaseous nitrogen source, and a gaseous carbon-hydrogen source, wherein:
  a) said silicon source comprises at least silicon;
  b) said nitrogen source comprises at least nitrogen; and
  c) said carbon-hydrogen source methylamine.

10. The method of claim 9, wherein said film is formed on a semiconductor device component, wherein said component comprises at least one member selected from the group consisting of:
  a) the sidewalls of a gate dielectric film;
  b) a gate electrode;
  c) a source electrode; and
  d) a drain electrode.

11. The method of claim 6, wherein said silicon nitride film is formed at a temperature between about 450° C. and about 600° C.

12. The method of claim 9, wherein:
  a) said method further comprises forming said silicon nitride film by low pressure CVD; and
  b) said silicon nitride film is formed at a temperature between about 450° C. and about 600° C.

* * * * *